US008779574B1

(12) United States Patent
Agness et al.

(10) Patent No.: US 8,779,574 B1
(45) Date of Patent: *Jul. 15, 2014

(54) SEMICONDUCTOR DIE INCLUDING A CURRENT ROUTING LINE HAVING NON-METALLIC SLOTS

(71) Applicant: Western Digital Technologies, Inc., Irvine, CA (US)

(72) Inventors: John R. Agness, Laguna Hills, CA (US); Mingying Gu, Aliso Viejo, CA (US)

(73) Assignee: Western Digital Technologies, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/854,898

(22) Filed: Apr. 1, 2013

Related U.S. Application Data

(63) Continuation of application No. 12/645,026, filed on Dec. 22, 2009, now Pat. No. 8,432,031.

(51) Int. Cl.
H01L 23/52 (2006.01)

(52) U.S. Cl.
USPC ........... 257/691; 257/767; 257/773; 257/787; 257/E23.079; 438/666; 438/687; 438/686; 174/261

(58) Field of Classification Search
USPC ........ 438/622, 625, 628, 597–599, 666, 674, 438/927, 687, 686; 257/762, 773, 774, 257/E23.002, E23.079, E23.01, E23.012, 257/E23.015, 698, E23.019, 691, 787, 767; 174/261
See application file for complete search history.

(56) References Cited

U.S. PATENT DOCUMENTS

| 4,914,503 | A | | 4/1990 | Shirato et al. |
| 5,572,067 | A | | 11/1996 | Thalapaneni |
| 5,579,207 | A | | 11/1996 | Hayden et al. |
| 5,583,381 | A | | 12/1996 | Hara et al. |
| 5,633,198 | A | | 5/1997 | Lur et al. |
| 5,689,139 | A | * | 11/1997 | Bui et al. ............. 257/758 |
| 5,726,904 | A | * | 3/1998 | Lin et al. ............. 257/773 |
| 5,846,874 | A | | 12/1998 | Hartranft et al. |
| 6,268,662 | B1 | | 7/2001 | Test et al. |
| 6,285,086 | B1 | | 9/2001 | Sota et al. |
| 6,329,722 | B1 | | 12/2001 | Shih et al. |
| 6,333,559 | B1 | | 12/2001 | Costrini et al. |
| 6,611,047 | B2 | | 8/2003 | Hu et al. |
| 6,653,710 | B2 | | 11/2003 | Adkisson et al. |

(Continued)

FOREIGN PATENT DOCUMENTS

JP H11-150213 A 6/1999

OTHER PUBLICATIONS

Office Action dated Nov. 9, 2011 from U.S. Appl. No. 12/645,026, 33 pages.

(Continued)

Primary Examiner — Fernando L Toledo
Assistant Examiner — Victoria K Hall

(57) ABSTRACT

A semiconductor die that includes a plurality of non-metallic slots that extend through a current routing line is disclosed. The semiconductor die comprises a semiconductor circuit that includes a plurality of semiconductor components and a current trace line that is coupled to a first semiconductor component. Further, the semiconductor die comprises a current routing line that is coupled with the current trace line. The current routing line includes a plurality of non-metallic slots that extend through the current routing line.

30 Claims, 4 Drawing Sheets

(56) References Cited

U.S. PATENT DOCUMENTS

| | | |
|---|---|---|
| 6,664,136 B2 | 12/2003 | Motonami et al. |
| 6,677,236 B2 * | 1/2004 | Umemura ............ 438/667 |
| 6,759,597 B1 | 7/2004 | Cutting et al. |
| 6,836,962 B2 | 1/2005 | Khandros et al. |
| 6,853,056 B2 | 2/2005 | Fukatani et al. |
| 6,940,108 B2 | 9/2005 | Cheng et al. |
| 6,960,831 B2 | 11/2005 | Burrell et al. |
| 7,180,161 B2 | 2/2007 | Chiang et al. |
| 7,190,079 B2 | 3/2007 | Andricacos et al. |
| 7,199,035 B2 * | 4/2007 | Chuang et al. ............ 438/599 |
| 7,199,475 B2 | 4/2007 | Ellis et al. |
| 7,265,436 B2 | 9/2007 | Huang et al. |
| 7,314,811 B2 | 1/2008 | Tan et al. |
| 8,432,031 B1 * | 4/2013 | Agness et al. ............ 257/691 |
| 2001/0010271 A1 | 8/2001 | Lin et al. |
| 2002/0175419 A1 | 11/2002 | Wang et al. |
| 2003/0071319 A1 | 4/2003 | Stierman et al. |
| 2004/0002198 A1 | 1/2004 | Lee et al. |
| 2008/0265385 A1 | 10/2008 | Tsai et al. |
| 2009/0174043 A1 | 7/2009 | Pruitt |
| 2010/0216341 A1 | 8/2010 | Bryant-Rich |

OTHER PUBLICATIONS

Office Action dated Apr. 24, 2011 from U.S. Appl. No. 12/645,026, 26 pages.

Advisory Action dated Jul. 17, 2012 from U.S. Appl. No. 12/645,026, 4 pages.

Interview Summary dated Aug. 14, 2012 from U.S. Appl. No. 12/645,026, 2 pages.

Office Action dated Oct. 23, 2012 from U.S. Appl. No. 12/645,026, 8 pages.

Interview Summary dated Oct. 24, 2012 from U.S. Appl. No. 12/645,026, 2 pages.

Notice of Allowance dated Feb. 20, 2013 from U.S. Appl. No. 12/645,026, 8 pages.

* cited by examiner

SEMICONDUCTOR DIE INCLUDING A CURRENT ROUTING LINE HAVING NON-METALLIC SLOTS

CROSS-REFERENCE TO RELATED APPLICATIONS

This continuation application is based upon and claims the benefit of priority for prior patent application Ser. No. 12/645,026 filed on Dec. 22, 2009, the entire contents of which are incorporated herein by reference.

BACKGROUND

Computing devices are routinely used at work, at home, and everywhere else. Computing devices advantageously enable electronic communication, data sharing (e.g., documents, pictures, music, film, etc.), the use of application-specific software, and access to information for electronic commerce through the Internet and other computer networks.

The term computing device generally refers to desktop computers, laptop computers, mobile computing devices (e.g., personal digital assistants (PDAs), cell-phones, etc.), as well as any other type of computer system. A computing device typically includes a processor and a memory as well as other types of electronic devices.

In order to reduce the size of computing devices and electronic devices, more and more system functions are being integrated into a single chip through very large scale integration (VLSI) and power large scale integration (PLSI) designs. As more and more functions are integrated onto a single chip, chip sizes have generally increased. At the same time, there is a trend in the computer industry towards smaller package outlines (e.g., minimizing plastic packaging) with an emphasis on surface-mount packages.

These two trends inevitably lead to increased compressive stresses on the plastic package and on the chip itself. For example, the occurrence of cracks from die mounting, deformed metal, passivation cracks, and multi-layer oxide cracks has increased.

Many of these cracks are created by package-induced surface shear stresses. These stresses are most pronounced at chip corners in passivations over wide aluminum buses, in narrow polysilicon interconnects passing under the wide bus, and in the multi-level oxides along the edges of the buses. These stresses can lead to cracks and complete device failure.

Further, copper bond wires are now being substituted for gold bond wires in the semiconductor industry as cost saving measures for the next generation of very large scale integration (VLSI) and power large scale integration (PLSI) designs.

Thus, there is a need for a semiconductor die that can accommodate increased stress.

DETAILED DESCRIPTION

Figure 1:
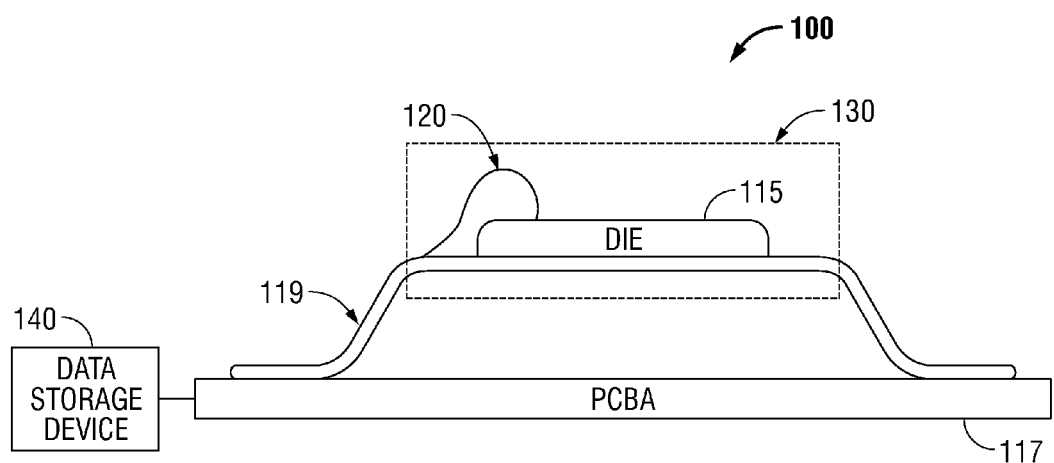
FIG. 1 is an exemplary side view of a semiconductor die implemented in an electronic system, according to one embodiment of the invention.

FIG. 1 is an exemplary side view of a semiconductor die implemented in an electronic system 100, according to one embodiment of the invention. Semiconductor die 115 may be mounted to a printed circuit board assembly (PCBA) 117 by a lead frame 119. Lead frame 119 may be comprised of copper or aluminum. Further, a bond wire 120 may connect a current routing line of the semiconductor die 115 to the PCBA 117 of electronic system 100. In one embodiment, bond wire 120 may be a copper wire.

Further, an epoxy package 130 may be utilized to mount the semiconductor die 115 to the lead frame 119. Also, in one embodiment, a data storage device 140 may be connected to PCBA 117 of electronic system 100.

In one embodiment, electronic system 100 may be a computing device that includes a semiconductor die 115, a PCBA 117, and a data storage device 140. It should be appreciated that system 100 may be a computing device such as a personal computer, a laptop computer, a network computer, a set-top box, a server, a router, an expander, a RAID, a mainframe, a mobile computing device (e.g., personal digital assistant (PDAs), cell-phone, etc.), or any other type of computing device or system having a processor and/or memory. In the case a data storage device 140 is utilized, data storage device 140 may be a hard disk drive, an optical drive, a CD-ROM, a DVD, a floppy drive, a flash memory, a random access memory (RAM, DRAM, SRAM), a read-only memory (ROM), a micro-drive, a non-volatile solid state memory, etc., or any type of storage device that connects and communicates with a PCBA.

For example, semiconductor die 115 may be a processor. For the purposes of the present specification, it should be appreciated that the term "processor", "microprocessor", and "controller", etc., refer to any machine or selection of logic that is capable of executing a sequence of instructions and should be taken to include, but not limited to, general purpose microprocessors, special purpose microprocessors, central processing units (CPUs), digital signal processor (DSPs), application specific integrated circuits (ASICs), signal processors, microcontrollers, etc. Further, it should be appreciated that the term processor, microprocessor, circuitry, controller, etc., refer to any type of logic or circuitry capable of executing logic, commands, instructions, software, firmware, functionality, etc.

Further, it should be appreciated that embodiments of the invention relate to any type of electronic system 100 that includes a semiconductor die 115 connected to a PCBA 117. As an example, semiconductor die 115 may be a processor, a microprocessor, a motor controller, a preamplifier, a memory device, or any type of electronic device that processes analog and/or digital signals. Thus, semiconductor die 115 may be utilized to process digital and/or analog signals to and from PCBA 117. Accordingly, system 100 may be any type of electronic system that utilizes a semiconductor die 115 that interfaces with a PCBA 117.

Figure 2A:
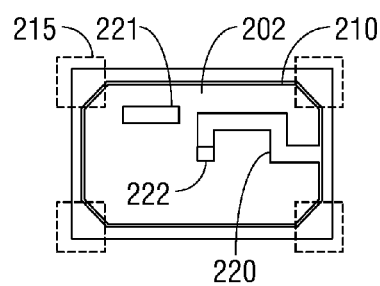
FIG. 2A is a diagram of a semiconductor die, according to one embodiment of the invention.

FIG. 2A is a diagram of a semiconductor die 202, according to one embodiment of the invention. Semiconductor die 202 comprises a semiconductor circuit that includes a plurality of semiconductor components and a current routing line 210. A current trace line 220 is coupled to the current routing line 210 and a first semiconductor component 222. It should be appreciated that semiconductor die 202 is a semiconductor circuit that includes a plurality of semiconductor components and that the semiconductor components may be any type of well known semiconductor components such as a memory, a processor, a transistor, etc. Further, although semiconductor die 202 is shown as being rectangular-shaped, it should be appreciated that semiconductor die 202 may be formed in a plurality of different types of shapes.

Current routing line 210 extends around semiconductor die 202, near the edges of the semiconductor die 202, in a generally rectangular fashion, but at the four corner regions 215 of the rectangular-shaped semiconductor die 202 extends at approximately 45° angles farther away from the edges and corners. As will be described, current routing line 210 may include a plurality of non-metallic slots that extend through the current routing line 210. In one example, both the non-metallic slots and the current routing line extend at 45° angles at the corner edges 215 of the semiconductor circuit 202.

Current routing line 210 may be coupled by a current trace line to a semiconductor component. As an example, as shown in FIG. 2A, current routing line 210 through current trace line 220 is connected to a semiconductor component 222 of the semiconductor circuit. Further, as should be appreciated, other current trace lines, such as current trace line 221, may be present to connect other semiconductor components of the semiconductor circuit 202.

Figure 2B:
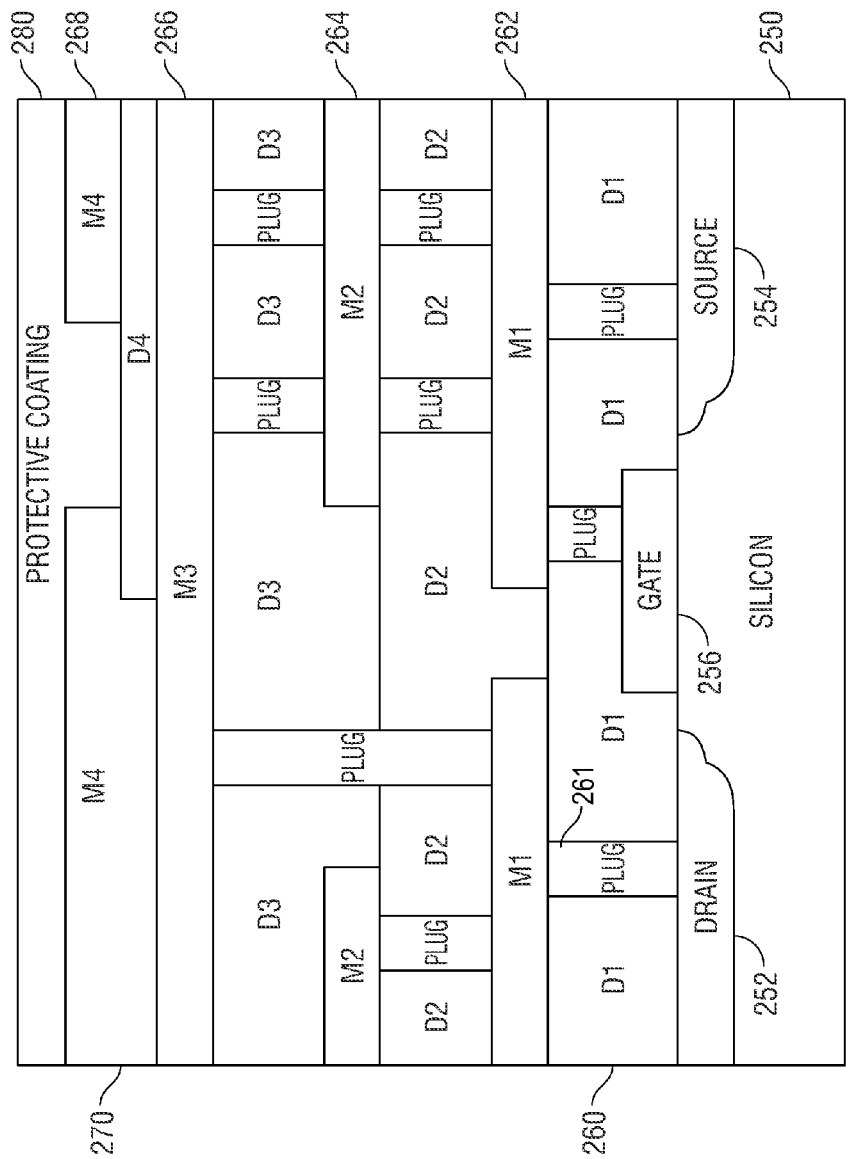
FIG. 2B is a diagram of a section of a semiconductor component, according to one embodiment of the invention.

As shown in FIG. 2B, in this example, a section of semiconductor component 222 is shown. Semiconductor component 222 may include a transistor having a drain 252 and a source 254 (embedded in silicon 250) and a gate 256 that are connected through current trace line 220 to current routing line 210. The transistor components (drain 252, source 254, and gate 256) may be connected through plugs 261 and through various dielectric layers (D1, D2 and D3) 260 to metallic layers (M1, M2, and M3) 262, 264, and 266. Semiconductor component 222 may also include an additional dielectric layer D4. The dielectric layers (D1 . . . D4) may be a doped oxide or an un-doped oxide. The metal layers (M1 . . . M3) may be aluminum with a small percentage of silicon and/or copper or may be another well-known type of metal. It should be appreciated that the transistors and dielectric and metallic layers are merely examples components.

Further, a protective coating 280 may be layered over top metallic layers M4 268 and 270. For example, a protective coating may be an organic overcoat. For example, a well known type of organic overcoat that may be utilized may be a polyimide. In one embodiment, the top metallic layers M4 268 and 270 may include a first metallic layer comprising copper (Cu) and a second metallic layer comprising nickel palladium (NiPd).

The transistor components of semiconductor component 222 may be connected through metallic layers M1 262, M2 264, and M3 266 to metallic layer M4. Metallic layer M4 may be connected to the current trace line 220 and through current trace line 220 to the current routing line 210. As an example, metallic layer M4 270 may be connected to current trace line 220 and to current routing line 210 whereas metallic layer M4 268 may be connected to another semiconductor component.

Figure 3:
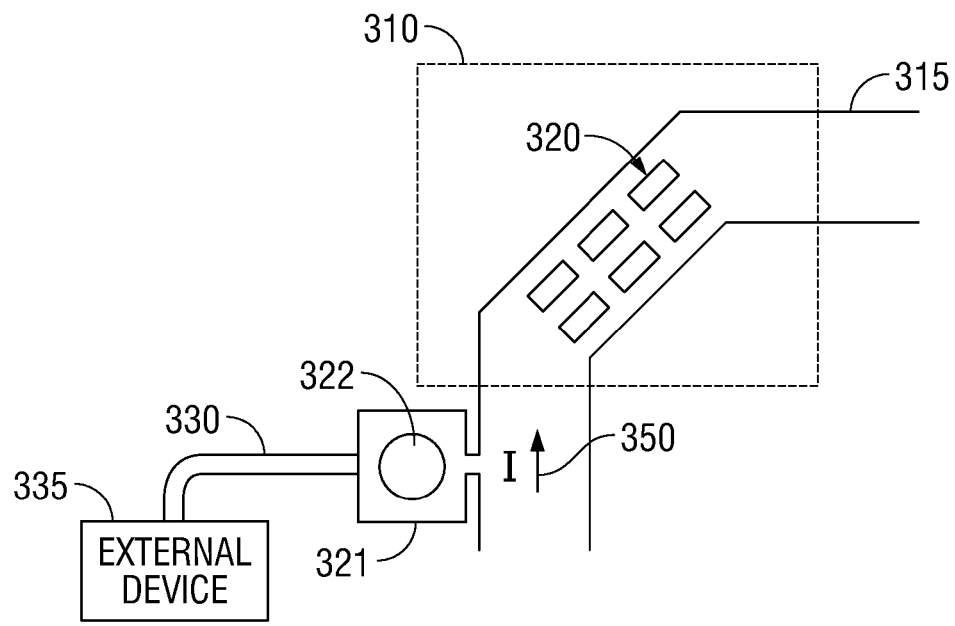
FIG. 3 is a diagram showing a current routing line at a corner area of the semiconductor die, according to one embodiment of the invention.

FIG. 3 is a diagram showing a current routing line 315 at a corner area 310 of the semiconductor die, according to one embodiment of the invention. At the corner area 310 of the semiconductor die, current routing line 315 includes a plurality of non-metallic slots 320 that extend through the current routing line 315. The plurality of non-metallic slots 320 may all be approximately equally-sized and equally-shaped. Although the plurality of non-metallic slots 320 are shown as being approximately rectangular-shaped it should be appreciated that many other types of shapes may be utilized, such as oval-shaped.

Further, the plurality of non-metallic slots 320 may be approximately equally-spaced from one another. Additionally, each non-metallic slot 320 is aligned approximately parallel to the current routing line 315. Moreover, in this embodiment, each of the non-metallic slots 320 and the current routing line extend at approximately 45° angles.

In one embodiment, the current routing line 315 may be a power bus. A bond pad 321 including a pin 322 connected to the power bus routing line 315 may connect the power bus routing line 315 to an external device 335 via a bond wire 330. For example, the external device 335 may be an external device included in the PCBA, such as, a motor controller.

In another embodiment, the current routing line 315 may be a signal routing line. A bond pad 321 including a pin 322 connected to the signal routing line 315 may connect the signal routing line 315 to an external device 335 via a bond wire 330. For example, the external device 335 may be an external device included in the PCBA, such as, a memory.

In this embodiment, the plurality of non-metallic slots 320 are aligned with the direction of current flow 350 of the current routing line 315. Further, the plurality of non-metallic slots 320 are spaced and aligned with one another in order to avoid reducing the current flow in the current routing line 315.

Figure 4:
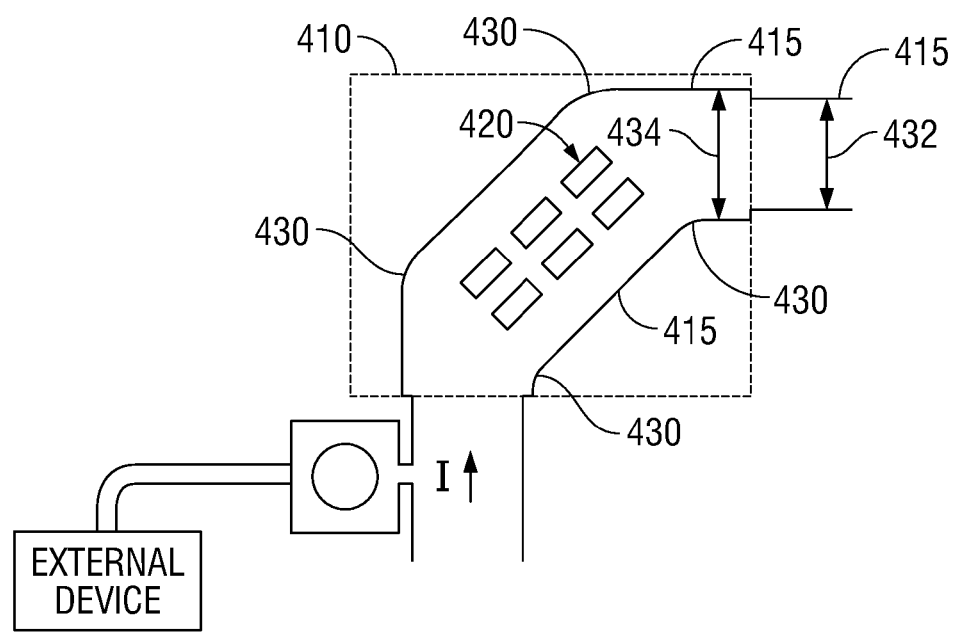
FIG. 4 is a diagram illustrating another embodiment of a corner area of the semiconductor die, according to one embodiment of the invention.

FIG. 4 is a diagram illustrating another embodiment of a corner area 410 of the semiconductor die, according to one embodiment of the invention. In this embodiment, as with FIG. 3, the non-metallic slots 420 are equally-spaced and aligned with one another and extend at 45° angles in parallel with the current routing line 415. However, in this embodiment, the current routing line 415 in the first corner area 410 includes rounded edges 430. Further, the edges of current routing line 415 in the first corner area 410 are wider than the remainder of the current routing line outside of the corner area 410. As can be seen in FIG. 4, the length of line 434 within current routing line 415 within the corner area 410 is greater than the length of line 432 outside of the corner area 410.

Figure 5:
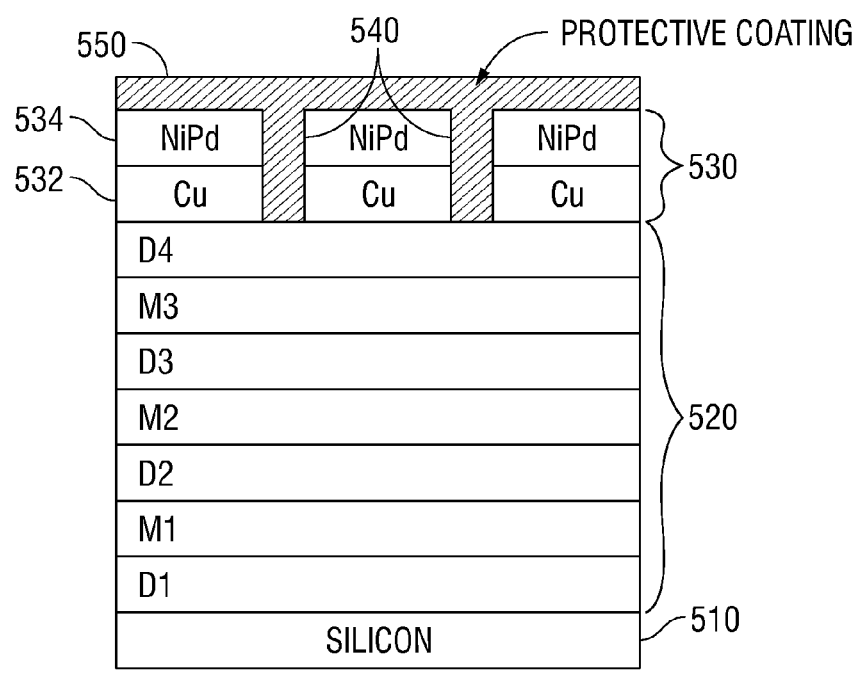
FIG. 5 is a cross-sectional diagram of slots in the current routing line at one of the corner areas of the semiconductor die, according to one embodiment of the invention.

FIG. 5 is a cross-sectional diagram of slots 540 in the current routing line at one of the corner areas of the semiconductor die (e.g. 310, 410), as previously described, according to one embodiment of the invention. As previously described, there is a silicon layer 510 and a plurality of dielectric layers (D1 . . . D4) and metallic layers (M1 . . . M3) 520. Further, a top metallic layer 530 is also included in the current routing line. In one embodiment, the top metallic layer includes a copper (Cu) layer 532 and a Nickel Palladium (NiPd) layer 534. In this embodiment, the NiPd metal layer 534 has been found to attach well to the Cu metal layer 532 and bonds well with copper bonding wire to external devices.

The slots 540 extend through the top metallic layer 530 as shown in FIG. 5. Further, the non-metallic slot may be filled with a protective coating 550, such as an organic overcoat. As one example, the organic overcoat may include a polyimide.

Typically, the corner areas of the current routing line are very prone to stress and breakage. However, it has been found that by utilizing the plurality of slots 540 that extend through the top metallic layer 530 of the current routing line, the current routing line's proneness to stress is significantly reduced. It should be appreciated that slots may also be utilized within other areas of the current routing line or in other areas of the semiconductor circuit, such as in the non-corner areas of the current routing line.

The embodiments of the invention may be readily implemented in semiconductor dies and in utilizing semiconductor dies with electronic systems. While the teachings of the invention have been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention as set forth in the appended claims. The specification and drawings are accordingly to be regarded as illustrative rather than restrictive.

What is claimed is:

1. A semiconductor die comprising:
   a semiconductor circuit comprising a plurality of semiconductor components the plurality of semiconductor components comprising a first semiconductor component;
   a current trace line coupled to the first semiconductor component;
   a current routing line coupled to the current trace line; and
   a corner area of the current routing line that includes:
      a first row of non-metallic slots that are equally-spaced from one another; and
      a second row of non-metallic slots that are equally-spaced from one another,
      wherein the non-metallic slots of the first and the second rows do not extend out of the corner area, and
      wherein the first row of non-metallic slots runs parallel to the second row of non-metallic slots and the non-metallic slots of the first and the second rows are spaced from one another to allow for current flow through the corner area.

2. The semiconductor die of claim 1, wherein the plurality of non-metallic slots are filled with a protective coating.

3. The semiconductor die of claim 2, wherein the protective coating is an organic overcoat.

4. The semiconductor die of claim 1, wherein the current routing line is a top metallic layer.

5. The semiconductor die of claim 4, wherein the current routing line comprises Copper (Cu).

6. The semiconductor die of claim 5, wherein the current routing line further comprises Nickel Palladium (NiPd).

7. The semiconductor die of claim 1, wherein the current routing line is a power bus.

8. The semiconductor die of claim 7, further comprising a pin connected to the power bus, the pin connecting the semiconductor circuit through the power bus to an external device.

9. The semiconductor die of claim 1, wherein the corner area includes rounded edges.

10. The semiconductor die of claim 9, wherein the corner area is wider than the current routing line outside of the corner area.

11. The semiconductor die of claim 1, wherein the non-metallic slots are approximately rectangular shaped.

12. A system comprising:
    a data storage device; and
    a semiconductor die coupled to the data storage device, the semiconductor die including:
       a semiconductor circuit comprising a plurality of semiconductor components the plurality of semiconductor components comprising a first semiconductor component,
       a current trace line coupled to the first semiconductor component,
       a current routing line coupled to the current trace line, and
       a corner area of the current routing line that includes:
          a first row of non-metallic slots that are equally-spaced from one another and
          a second row of non-metallic slots that are equally-spaced from one another,
          wherein the non-metallic slots of the first and the second rows do not extend out of the corner area, and
          wherein the first row of non-metallic slots runs parallel to the second row of non-metallic slots and the non-metallic slots of the first and the second rows are spaced from one another to allow for current flow through the corner area.

13. The system of claim 12, wherein the data storage device is a disk drive.

14. The system of claim 12, wherein the data storage device is a flash memory.

15. The system of claim 12, wherein the plurality of non-metallic slots are filled with a protective coating.

16. The system of claim 15, wherein the protective coating is an organic overcoat.

17. The system of claim 12, wherein the current routing line is a top metallic layer.

18. The system of claim 17, wherein the current routing line comprises Copper (Cu).

19. The system of claim 18, wherein the current routing line further comprises Nickel Palladium (NiPd).

20. The system of claim 12, wherein the current routing line is a power bus.

21. The system of claim 20, further comprising a pin connected to the power bus, the pin connecting the semiconductor circuit through the power bus to an external device.

22. The system of claim 12, wherein the corner area includes rounded edges.

23. The system of claim 12, wherein the corner area is wider than the current routing line outside of the corner area.

24. The system of claim 12, wherein the non-metallic slots are approximately rectangular shaped.

25. A method for forming a plurality of non-metallic slots in a semiconductor die comprising:
    coupling a current trace line to a first semiconductor component of the semiconductor die;
    coupling a current routing line to the current trace line; and
    forming a plurality of non-metallic slots in a corner area of the current routing line of the semiconductor die,
    wherein the corner area of the current routing line includes:
       a first row of non-metallic slots that are equally-spaced from one another; and
       a second row of non-metallic slots that are equally-spaced from one another,
       wherein the non-metallic slots of the first and the second rows do not extend out of the corner area, and
       wherein the first row of non-metallic slots runs parallel to the second row of non-metallic slots and the non-metallic slots of the first and the second rows are spaced from one another to allow for current flow through the corner area.

26. The method of claim 25, further comprising filling the plurality of non-metallic slots with a protective coating.

27. The method of claim 26, wherein the protective coating is an organic overcoat.

28. The method of claim 25, wherein the current routing line is a top metallic layer.

29. The method of claim 28, wherein the current routing line comprises Copper (Cu).

30. The method of claim 29, wherein the current routing line further comprises Nickel Palladium (NiPd).

* * * * *